(12) United States Patent
Kuromitsu et al.

(10) Patent No.: US 10,607,907 B2
(45) Date of Patent: Mar. 31, 2020

(54) CERAMIC-ALUMINUM CONJUGATE, POWER MODULE SUBSTRATE, AND POWER MODULE

(71) Applicants: MITSUBISHI MATERIALS CORPORATION, Tokyo (JP); The University of Tokyo, Tokyo (JP)

(72) Inventors: Yoshirou Kuromitsu, Saitama (JP); Kazuhiro Akiyama, Naka-gun (JP); Toshiyuki Nagase, Kawagoe (JP); Yoshiyuki Nagatomo, Saitama (JP); Nobuyuki Terasaki, Saitama (JP); Yuichi Ikuhara, Tokyo (JP); Naoya Shibata, Tokyo (JP); Akihito Kumamoto, Tokyo (JP)

(73) Assignees: MITSUBISHI MATERIALS CORPORATION, Tokyo (JP); THE UNIVERSITY OF TOKYO, Tokyo (JP)

( * ) Notice: Subject to any disclaimer, the term of this patent is extended or adjusted under 35 U.S.C. 154(b) by 153 days.

(21) Appl. No.: 15/771,595

(22) PCT Filed: Aug. 29, 2016

(86) PCT No.: PCT/JP2016/075163
§ 371 (c)(1),
(2) Date: Apr. 27, 2018

(87) PCT Pub. No.: WO2017/077761
PCT Pub. Date: May 11, 2017

(65) Prior Publication Data
US 2018/0323122 A1    Nov. 8, 2018

(30) Foreign Application Priority Data
Nov. 6, 2015   (JP) .................................. 2015-218892

(51) Int. Cl.
*H01L 23/15*      (2006.01)
*H01L 23/36*      (2006.01)
(Continued)

(52) U.S. Cl.
CPC ............ *H01L 23/15* (2013.01); *B23K 1/0016* (2013.01); *B23K 35/0238* (2013.01);
(Continued)

(58) Field of Classification Search
CPC ......... H01L 23/12; H01L 23/36; H01L 23/15; H01L 23/3735; B23K 35/0238;
(Continued)

(56) References Cited

U.S. PATENT DOCUMENTS

2015/0055303 A1    2/2015   Nagatomo et al.

FOREIGN PATENT DOCUMENTS

EP          2833400 A1       2/2015
JP       2001-044345 A       2/2001
(Continued)

OTHER PUBLICATIONS

Search Report dated May 22, 2019, issued for the European patent application No. 16861830.4.
(Continued)

*Primary Examiner* — Tucker J Wright
*Assistant Examiner* — Scott Stowe
(74) *Attorney, Agent, or Firm* — Locke Lord LLP (57) ABSTRACT

The present invention provides a ceramic-aluminum bonded body in which Mg-containing oxide having a spinel crystal structure are dispersed in an aluminum member within a range of 2 μm in a thickness direction from a bonded interface with a ceramic member, a segregated portion in which Mg, Si, and O is segregated is formed in the aluminum member in the vicinity of the bonded interface with the ceramic member, mass ratios of Mg, Si, and O between the
(Continued)

segregated portion and a position spaced by 10 μm from the bonded interface toward an aluminum member side are within predetermined ranges, and the amount of Mg at the position spaced by 10 μm from the bonded interface toward the aluminum member side is 0.8 mass % or less.

6 Claims, 5 Drawing Sheets

(51) Int. Cl.
| | |
|---|---|
| *H01L 23/12* | (2006.01) |
| *C04B 37/02* | (2006.01) |
| *B23K 1/00* | (2006.01) |
| *B23K 35/02* | (2006.01) |
| *B23K 35/28* | (2006.01) |
| *H01L 23/373* | (2006.01) |

(52) U.S. Cl.
CPC ............ *B23K 35/286* (2013.01); *C04B 37/02* (2013.01); *H01L 23/12* (2013.01); *H01L 23/36* (2013.01); *H01L 23/3735* (2013.01); *H01L 2224/32225* (2013.01)

(58) Field of Classification Search
CPC .... B23K 35/286; B23K 20/02; B23K 20/023; B23K 20/026; B23K 1/0016
See application file for complete search history.

(56) References Cited

FOREIGN PATENT DOCUMENTS

| | | |
|---|---|---|
| JP | 2001-062588 A | 3/2001 |
| JP | 2001-079684 A | 3/2001 |
| JP | 2001-102703 A | 4/2001 |
| JP | 2001-144433 A | 5/2001 |
| JP | 2001-203299 A | 7/2001 |
| JP | 2010-258420 A | 11/2010 |
| JP | 2012-074532 A | 4/2012 |
| JP | 2012-164708 A | 8/2012 |
| JP | 2013-182960 A | 9/2013 |
| JP | 2013-214576 A | 10/2013 |
| WO | 03/090277 A1 | 10/2003 |
| WO | 2015/105124 A1 | 7/2015 |

OTHER PUBLICATIONS

International Search Report dated Sep. 27, 2016, issued for PCT/JP2016/075163 and English translation thereof.

CERAMIC-ALUMINUM CONJUGATE, POWER MODULE SUBSTRATE, AND POWER MODULE

TECHNICAL FIELD

The present invention relates to a ceramic-aluminum bonded body obtained by bonding a ceramic member made of AlN and an aluminum member, a power module substrate including a ceramic substrate made of AlN and an aluminum plate bonded to the ceramic substrate, and a power module including the power module substrate.

Priority is claimed on Japanese Patent Application No. 2015-218892 filed on Nov. 6, 2015, the content of which is incorporated herein by reference.

BACKGROUND ART

In a semiconductor device such as an LED and a power module, a structure in which semiconductor element is bonded onto a circuit layer made of a conductive material is provided.

In a power semiconductor element for high-power control used for controlling wind power generation, an electric vehicle, a hybrid vehicle, and the like, a heating value is large. Therefore, as a substrate on which the power semiconductor element is mounted, for example, a power module substrate including a ceramic substrate made of AlN (aluminum nitride), $Al_2O_3$ (alumina), and the like, and a circuit layer which is formed by bonding a metal sheet excellent in conductivity to one face of the ceramic substrate have been widely used from the related art. As the power module substrate, a substrate in which a metal layer is formed by bonding a metal sheet to the other face of the ceramic substrate is also provided.

For example, in PTL 1, a power module substrate, in which an aluminum plate serving as a circuit layer is bonded to one face of the ceramic substrate made of AlN (aluminum nitride) via an Al—Si-based brazing material and an aluminum plate serving as a metal layer is bonded to the other face of the ceramic substrate via an Al—Si-based brazing material, has been proposed.

In such a power module substrate, a semiconductor element as a power element is mounted on the circuit layer via a solder layer to be used as a power module. In addition, a copper heat sink may be bonded to a metal layer side via solder.

In addition, in PTLs 2 to 5, a ceramic circuit board, in which a ceramic substrate and an aluminum plate are bonded to each other using a brazing material containing Mg, and Mg or the like is unevenly distributed in a bonded interface between the brazing material and the aluminum plate or a bonded interface between the brazing material and the ceramic substrate, has been proposed.

In these ceramic circuit boards, a bonding property between the ceramic substrate and the aluminum plate is improved by removing an oxide which inhibits bonding by unevenly distributed Mg.

CITATION LIST

Patent Literature

[PTL 1] Republished Japanese Translation No. WO2003/090277 of the PCT International Publication for Patent Applications

[PTL 2] Japanese Unexamined Patent Application, First Publication No. 2001-044345

[PTL 3] Japanese Unexamined Patent Application, First Publication No. 2001-062588

[PTL 4] Japanese Unexamined Patent Application, First Publication No. 2001-102703

[PTL 5] Japanese Unexamined Patent Application, First Publication No. 2001-144433

SUMMARY OF INVENTION

Technical Problem

In recent years, miniaturization and metal sheet thinning of the power module advance and usage environment thereof becomes more severe. Particularly, at the time of temperature cycle load, since a large shear force acts on the bonded interface between the aluminum plate and the ceramic substrate, it is further required to improve bonding reliability.

In PTLs 2 to 5, the bonding property is improved by unevenly distributing Mg to a bonded interface between the brazing material and the aluminum plate or a bonded interface between the brazing material and the ceramic substrate. However, in a case of merely unevenly distributing Mg, the bonding between the ceramic substrate and the aluminum plate is rather inhibited and the bonding reliability may deteriorate. In addition, aluminum in the vicinity of the bonded interface is hardened by the segregated Mg, and there is a possibility that a crack occurs in the ceramic substrate at the time of temperature cycle load.

The present invention has been made in view of the above-described circumstances, and an object thereof is to provide a ceramic-aluminum bonded body, a power module substrate, and a power module including the power module substrate, in each of which the ceramic member and the aluminum member are reliably bonded to each other, and which are excellent in bonding reliability at the time of temperature cycle load and capable of suppressing the occurrence of cracking in the ceramic member.

Solution to Problem

In order to solve such a problem so as to achieve the object described above, a ceramic-aluminum bonded body of an aspect of the present invention is provided. The ceramic-aluminum bonded body includes: a ceramic member made of AlN; and an aluminum member, the ceramic member and the aluminum member being bonded together, wherein Mg-containing oxides having a spinel crystal structure are dispersed in the aluminum member within a range of 2 μm in a thickness direction from a bonded interface with the ceramic member, a segregated portion in which Mg, Si, and O are segregated is formed in the aluminum member in the vicinity of the bonded interface with the ceramic member, ratios of an amount of Mg [Mg]s, an amount of Si [Si]s, and an amount of O [O]s in the segregated portion to an amount of Mg $[Mg]_I$, an amount of Si $[Si]_I$, and an amount of O $[O]_I$, respectively, at a position spaced by 10 μm from the bonded interface toward an aluminum member side are within ranges of $1<[Mg]_S/[Mg]_I\le15$, $1<[Si]_S/[Si]_I\le25$, and $1<[O]_S/[O]_I\le25$, and the amount of Mg $[Mg]_I$ at the position spaced by 10 μm from the bonded interface toward the aluminum member side is 0.8 mass % or less.

In the ceramic-aluminum bonded body having such a configuration, the Mg-containing oxide having a spinel crystal structure is dispersed in the aluminum member within the range of 2 μm in a thickness direction from a bonded interface with the ceramic member. Here, the Mg-containing oxide having a spinel crystal structure is formed by reaction between an oxide film formed on a surface of the aluminum member and Mg. In a case where the Mg-containing oxide having a spinel crystal structure is dispersed, the oxide film formed on the surface of the aluminum member is sufficiently removed by reaction with the Mg. Accordingly, it becomes possible to reliably bond the aluminum member and the ceramic member to each other.

In addition, in the ceramic-aluminum bonded body, the segregated portion in which Mg, Si, and O are segregated is included, the ratios of the amount of Mg $[Mg]_S$, the amount of Si $[Si]_S$, and the amount of O $[O]_S$ in the segregated portion to the amount of Mg $[Mg]_I$, the amount of Si $[Si]_I$, and the amount of O $[O]_I$, respectively, at the position spaced by 10 μm from the bonded interface toward the aluminum member side are within the ranges of $1<[Mg]_S/[Mg]_I\leq15$, $1<[Si]_S/[Si]_I\leq25$, and $1<[O]_S/[O]_I\leq25$, and Mg, Si, and O are segregated in the aluminum member in the vicinity of the bonded interface with the ceramic member. Accordingly, it is possible to stabilize interfacial energy and improve bonding reliability between the aluminum member and the ceramic member. In addition, since an amount of Mg, Si, and O segregated is suppressed, the vicinity of the bonded interface of the aluminum member with the ceramic member can be prevented from excessively hardening and cracking or the like can be prevented from occurring in the ceramic member.

Further, since the amount of Mg $[Mg]_I$ at the position spaced by 10 μm from the bonded interface toward the aluminum member side is 0.8 mass % or less, the aluminum member itself can be prevented from hardening and deformation resistance of the aluminum member can be prevented from increasing.

Here, in the ceramic-aluminum bonded body according to the aspect of the present invention, it is preferable that, in the segregated portion, an amount of Cu is 1.2 mass % or less, and an amount of Fe be 0.6 mass % or less.

In this case, since in the segregated portion, the amount of Cu is limited to 1.2 mass % or less and the amount of Fe is limited to 0.6 mass % or less, the vicinity of the bonded interface of the aluminum member with the ceramic member can be prevented from excessively hardening and cracking or the like can be prevented from occurring in the ceramic member.

In addition, a power module substrate of another aspect of the present invention is provided. The power module substrate includes: a ceramic substrate made of AlN; and an aluminum plate bonded to the ceramic substrate, wherein Mg-containing oxides having a spinel crystal structure are dispersed in the aluminum plate within a range of 2 μm in a thickness direction from a bonded interface with the ceramic substrate, a segregated portion in which Mg, Si, and O are segregated is in an area of the aluminum plate in the vicinity of the bonded interface with the ceramic substrate, ratios of an amount of Mg $[Mg]_S$, an amount of Si $[Si]_S$, and an amount of O $[O]_S$ in the segregated portion respectively to an amount of Mg $[Mg]_I$, an amount of Si $[Si]_I$, and an amount of O $[O]_I$ at a position spaced by 10 μm from the bonded interface toward an aluminum plate side are respectively within ranges of $1<[Mg]_S/[Mg]_I\leq15$, $1<[Si]_S/[Si]_I\leq25$, and $1<[O]_S/[O]_I\leq25$, and the amount of Mg $[Mg]_I$ at the position spaced by 10 μm from the bonded interface toward the aluminum plate side is 0.8 mass % or less.

In the power module substrate having such a configuration, the Mg-containing oxides having the spinel crystal structure are dispersed in the aluminum plate within the range of 2 μm in the thickness direction from the bonded interface with the ceramic substrate. Therefore, the oxide film formed on the surface of the aluminum plate is sufficiently removed by reaction with the Mg, and it becomes possible to reliably bond the aluminum plate and the ceramic substrate to each other.

In addition, in the power module substrate described above, since the Mg, Si, and O are segregated in the aluminum plate in the vicinity of the bonded interface with the ceramic substrate, it is possible to stabilize interfacial energy and improve bonding reliability between the aluminum plate and the ceramic substrate. In addition, the vicinity of the bonded interface of the aluminum plate with the ceramic substrate can be prevented from excessively hardening. When the temperature cycle is loaded on the power module substrate, cracking or the like can be prevented from occurring in the ceramic substrate.

Further, when the amount of Mg $[Mg]_I$ at the position spaced by 10 μm from the bonded interface toward the aluminum plate side is 0.8 mass % or less, the deformation resistance of the aluminum plate can be prevented from increasing.

Here, in the power module substrate according to the aspect of the present invention, it is preferable that, in the segregated portion, an amount of Cu is 1.2 mass % or less, and an amount of Fe be 0.6 mass % or less.

In this case, since in the segregated portion, the amount of Cu is limited to 1.2 mass % or less and the amount of Fe is limited to 0.6 mass % or less, the vicinity of the bonded interface of the aluminum plate with the ceramic substrate can be prevented from excessively hardening. When the temperature cycle is loaded on the power module substrate, cracking or the like can be prevented from occurring in the ceramic substrate.

According to still another aspect of the present invention, a power module is provided, including: the power module substrate described above; and a semiconductor element.

In the power module having such a configuration, since the power module substrate is included, the ceramic substrate and the aluminum plate are firmly bonded to each other, which is particularly excellent in reliability.

Advantageous Effects of Invention

According to the present invention, it is possible to provide a ceramic-aluminum bonded body, a power module substrate, and a power module including the power module substrate, in each of which the ceramic member and the aluminum member are reliably bonded to each other, and which are excellent in bonding reliability at the time of temperature cycle load and capable of suppressing the occurrence of cracking in the ceramic member.

DESCRIPTION OF EMBODIMENTS

Hereinafter, an embodiment of the present invention will be described with reference to the attached drawings. A ceramic-aluminum bonded body according to the embodiment is a power module substrate 10 including a ceramic substrate 11 as a ceramic member made of AlN, a circuit layer 12 to which an aluminum plate 22 is bonded as an aluminum member, and a metal layer 13 to which an aluminum plate 23 is bonded.

Figure 1:
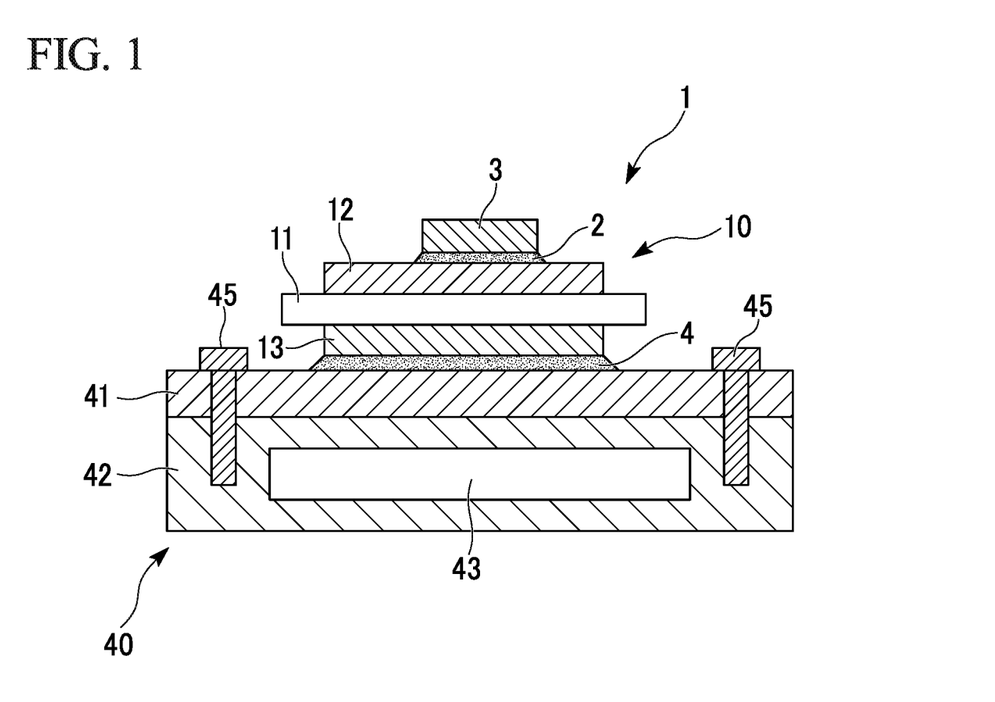
FIG. 1 is a schematic explanatory diagram of a power module using a power module substrate according to an embodiment of the present invention.

FIG. 1 shows a power module 1 using the power module substrate 10 according to the embodiment of the present invention.

The power module 1 includes the power module substrate 10 in which the circuit layer 12 and the metal layer 13 are disposed on the ceramic substrate 11, a semiconductor element 3 which is bonded to one face (an upper face in FIG. 1) of the circuit layer 12 via a first solder layer 2, and a heat sink 40 which is bonded to the other face (a lower face in FIG. 1) of the metal layer 13 via a second solder layer 4.

Here, the first solder layer 2 and the second solder layer 4 are, for example, made of Sn—Ag-based solder material, Sn—In-based solder material or Sn—Ag—Cu-based solder material. In the present embodiment, a Ni-plated layer (not shown) is provided between the circuit layer 12 and the first solder layer 2, and between the metal layer 13 and the second solder layer 4.

The power module substrate 10 includes the ceramic substrate 11, the circuit layer 12 which is disposed on one face (an upper face in FIG. 1) of the ceramic substrate 11, and the metal layer 13 which is disposed on the other face (a lower face in FIG. 1) of the ceramic substrate 11.

The ceramic substrate 11 prevents the circuit layer 12 and the metal layer 13 from being electrically connected therebetween. In the present embodiment, the ceramic substrate 11 is made of AlN (aluminum nitride) having high insulation. In addition, a thickness of the ceramic substrate 11 is set within a range of 0.2 to 1.5 mm, and in the present embodiment, is set to 0.635 mm.

Figure 4:
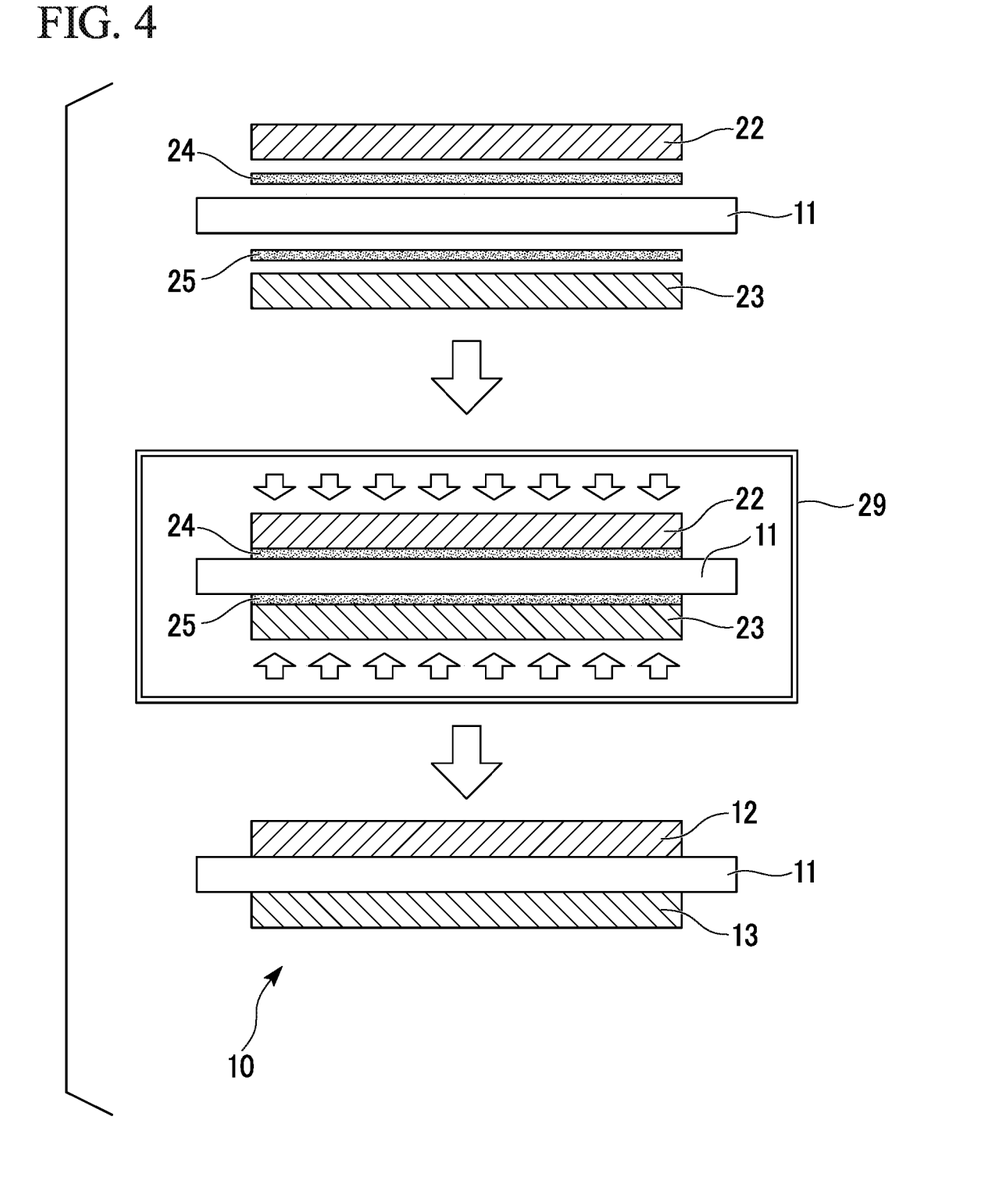
FIG. 4 is an explanatory diagram showing the method of manufacturing the power module substrate according to the embodiment of the present invention.

The circuit layer 12 is formed by bonding the metal sheet having conductivity to one face of the ceramic substrate 11. In the present embodiment, as shown in FIG. 4, the circuit layer 12 is formed by bonding the aluminum plate 22 made of an aluminum (called 4N aluminum) rolled sheet having a purity of 99.99 mass % or higher to the ceramic substrate 11. In the circuit layer 12, a circuit pattern is formed, and one face (an upper face in FIG. 1) of the circuit layer 12 serves as a mounting face on which the semiconductor element 3 is mounted. Here, a thickness of the circuit layer 12 (aluminum plate 22) is set within a range of 0.05 mm or more and less than 1.1 mm, and in the present embodiment, is set to 0.6 mm The metal layer 13 is formed by bonding the metal sheet which is excellent in thermal conductivity to the other face of the ceramic substrate 11. In the present embodiment, as shown in FIG. 4, the metal layer 13 is formed by bonding the aluminum plate 23 made of an aluminum (called 4N aluminum) rolled sheet having a purity of 99.99 mass % or higher to the ceramic substrate 11. Here, a thickness of the metal layer 13 (aluminum plate 23) is set within a range of 0.05 mm or more and less than 3.0 mm, and in the present embodiment, is set to 0.6 mm.

The heat sink 40 is to cool the power module substrate 10 described above, and includes a radiator plate 41 bonded to the power module substrate 10 and a cooler 42 which is disposed on the radiator plate 41 in a laminated manner.

The radiator plate 41 diffuses heat from the power module substrate 10 described above in a surface direction, and in the present embodiment, is made of a copper plate which is excellent in thermal conductivity.

As shown in FIG. 1, the cooler 42 includes a flow path 43 for circulating a cooling medium (for example, cooling water). The cooler 42 is desirably made of a material which has good thermal conductivity, and in the present embodiment, is made of A6063 (aluminum alloy).

As shown in FIG. 1, the radiator plate 41 and the cooler 42 are fastened by a fixing screw 45.

Figure 2:
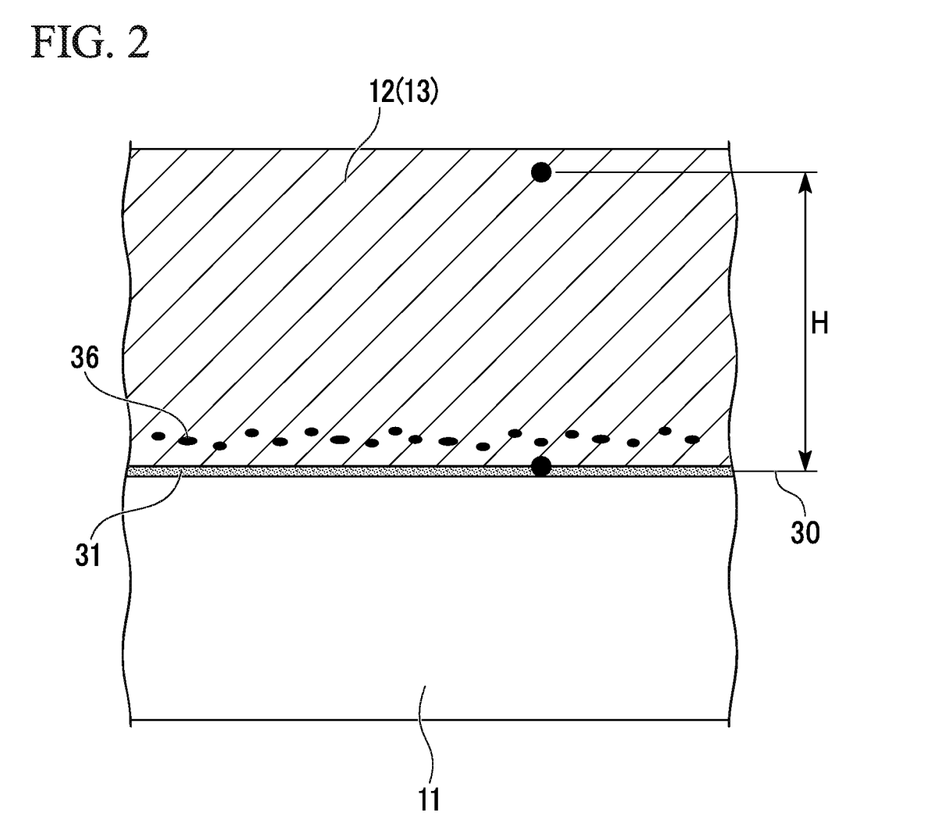
FIG. 2 is a schematic explanatory diagram of the vicinity of a bonded interface between a ceramic substrate and an aluminum plate (a circuit layer and a metal layer) of the power module substrate according to the embodiment of the present invention.

In the present embodiment, as shown in FIG. 2, Mg-containing oxides 36 having a spinel crystal structure are dispersed in the circuit layer 12 or the metal layer 13 within a range of 2 μm in a thickness direction from a bonded interface 30 with the ceramic substrate 11.

The Mg-containing oxide 36 can be confirmed by the following method.

With respect to the bonded interface, an electron diffraction pattern is obtained using a transmission electron microscope (TEM) (Titan ChemiSTEM manufactured by FEI Company, an acceleration voltage of 200 kV) to analyze a composition using an energy-dispersive X-ray spectroscopy (EDS) (NSS7 manufactured by Thermo Fisher Scientific Inc.). An area which was identified as a spinel structure from the electron diffraction pattern and an area in which the composition was Mg=6 to 12 at %, O=30 to 60 at %, and Al=balance were set as Mg-containing oxide 36. The electron diffraction pattern is obtained by performing irradiation with an electron beam narrowed down to approximately 1 nm (nanobeam diffraction (NBD) method).

The Mg-containing oxide 36 contains Mg and Al. An area ratio of the Mg-containing oxide 36 within a range of 2 μm in a thickness direction from the bonded interface 30 is in a range of 2% or higher and 18% or lower. It is preferable that 90% or more of observed Mg-containing oxide 36 be present within a range of 1 μm in the thickness direction from the bonded interface 30.

In addition, in the present embodiment, as shown in FIG. 2, a segregated portion 31 in which Mg, Si, and O are segregated is formed in the vicinity of the bonded interface 30 of the circuit layer 12 or the metal layer 13 with the ceramic substrate 11. The segregated portion 31 may be within a range of 0.01 μm in the thickness direction from the bonded interface 30 of the circuit layer 12 and the metal layer 13 with the ceramic substrate 11, but is not limited thereto.

Here, ratios of an amount of Mg $[Mg]_S$, an amount of Si $[Si]_S$, and an amount of O $[O]_S$ in the segregated portion 31 to an amount of Mg $[Mg]_I$, an amount of Si $[Si]_I$, and an amount of O $[O]_I$, respectively, at a position spaced by H=10 μm from the bonded interface 30 toward a circuit layer 12 side or a metal layer 13 side are within ranges of $1<[Mg]_S/[Mg]_I \leq 15$, $1<[Si]_S/[Si]_I \leq 25$, and $1<[O]_S/[O]_I \leq 25$. The ratios of the amount of Mg $[Mg]_S$, the amount of Si $[Si]_S$, and the amount of O $[O]_S$ in the segregated portion 31 to the amount of Mg $[Mg]_I$, the amount of Si $[Si]_I$, and the amount of O $[O]_I$, respectively, at the position spaced by H=10 μm from the bonded interface 30 toward the circuit layer 12 side or the metal layer 13 side are preferably $1.14<[Mg]_S/$ $[Mg]_I \leq 12.67$, $1.16 < [Si]_S/[Si]_I \leq 12.67$, and $1.45 < [O]_S/[O]_I \leq 11.73$, and more preferably $1.52 < [Mg]_S/[Mg]_I \leq 5.50$, $2.31 < [Si]_S/[Si]_I \leq 8.35$, and $1.93 < [O]_S/[O]_I \leq 7.64$. However, the ratios are not limited thereto.

The amount of Mg $[Mg]_S$ in the segregated portion 31 is set in a range of 0.1 mass % or more and 1.5 mass % or less, and the amount of Si $[Si]_S$ is in a range of 0.1 mass % or more and 2.5 mass % or less, and the amount of O $[O]_S$ is set to 1.5 mass % or more and 15 mass % or less.

As shown in FIG. 2, the amount of Mg $[Mg]_S$, the amount of Si $[Si]_S$, and the amount of O $[O]_S$ in the segregated portion 31 are obtained by performing a TEM analysis on a part of the bonded interface 30 containing the segregated portion 31, with a beam diameter of 1 nm. Similarly, the amount of Mg $[Mg]_I$, the amount of Si $[Si]_I$, and the amount of O $[O]_I$ at the position spaced by H=10 μm from the bonded interface 30 toward the circuit layer 12 side or the metal layer 13 side are also obtained by performing the TEM analysis with a beam diameter of 1 nm.

In addition, in the present embodiment, the amount of Mg $[Mg]_I$ at the position spaced by H=10 μm from the bonded interface 30 toward the circuit layer 12 side or the metal layer 13 side is 0.8 mass % or less. The amount of Mg $[Mg]_I$ at the position spaced by H=10 μm from the bonded interface 30 toward the circuit layer 12 side or the metal layer 13 side is preferably 0.1 mass % or more and 0.5 mass % or less, but is not limited thereto.

Further, in the present embodiment, an amount of Cu in the segregated portion 31 is 1.2 mass % or less and an amount of Fe is 0.6 mass % or less. The amount of Cu in the segregated portion 31 is preferably 0.00 mass % or more and 0.05 mass % or less and the amount of Fe is preferably 0.00 mass % or more and 0.05 mass % or less, but is not limited thereto.

Next, a method of manufacturing the power module substrate 10 according to the embodiment described above will be described with reference to FIGS. 3 and 4.

(Circuit Layer and Metal Layer-Forming Step S01)

Figure 3:
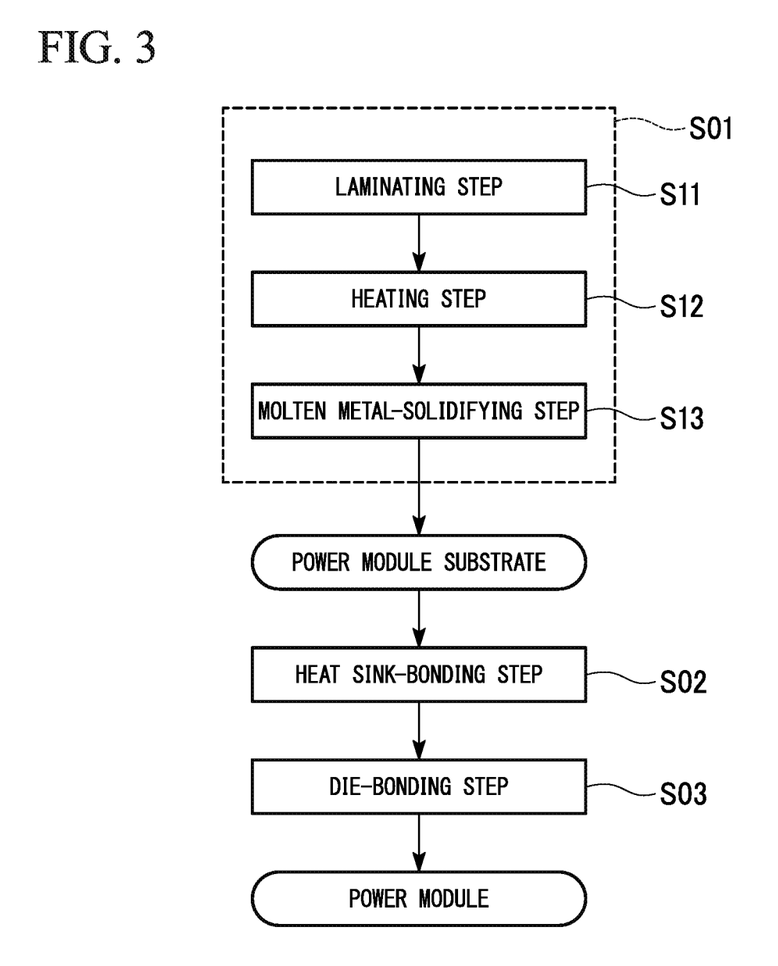
FIG. 3 is a flowchart showing a method of manufacturing the power module substrate according to the embodiment of the present invention.

First, the aluminum plates 22 and 23 and the ceramic substrate 11 are bonded to each other to form the circuit layer 12 and the metal layer 13.

In the present embodiment, as shown in FIG. 3, a circuit layer and metal layer-forming step S01 includes a laminating step S11, a heating step S12, and a molten metal-solidifying step S13.

In the laminating step S11, as shown in FIG. 4, the aluminum plate 22 is laminated on one face of the ceramic substrate 11 via an Al—Si—Mg-based brazing material 24 and the aluminum plate 23 is laminated on the other face of the ceramic substrate 11 via an Al—Si—Mg-based brazing material 25, thereby forming a laminate.

Here, in the present embodiment, as the Al—Si—Mg-based brazing materials 24 and 25, brazing material foil made of aluminum alloy containing Si in a range of 1 mass % or more and 12 mass % or less and Mg in a range of 0.01 mass % or more and 0.05 mass % or less is used, and each thickness of the brazing materials 24 and 25 is in a range of 5 μm or more and 30 μm or less.

In the heating step S12, the laminate described above is charged into a heating furnace 29 in a state of being pressed in a laminating direction to be heated. Then, some of the brazing materials 24 and 25 and the aluminum plates 22 and 23 are melted and molten metal areas are formed respectively in interfaces between the aluminum plates 22 and 23 and the ceramic substrate 11. Conditions of the heating step S12 are set such that an atmosphere is a vacuum atmosphere ($10^{-4}$ Pa or higher and $10^{-3}$ Pa or lower) or a nitrogen atmosphere in which an oxygen tension is 500 volppm or lower, a bonding temperature is in a range of 580° C. or higher and 650° C. or lower, and a heating time is in a range of 1 minute or longer and 180 minutes or shorter.

Figure 5:
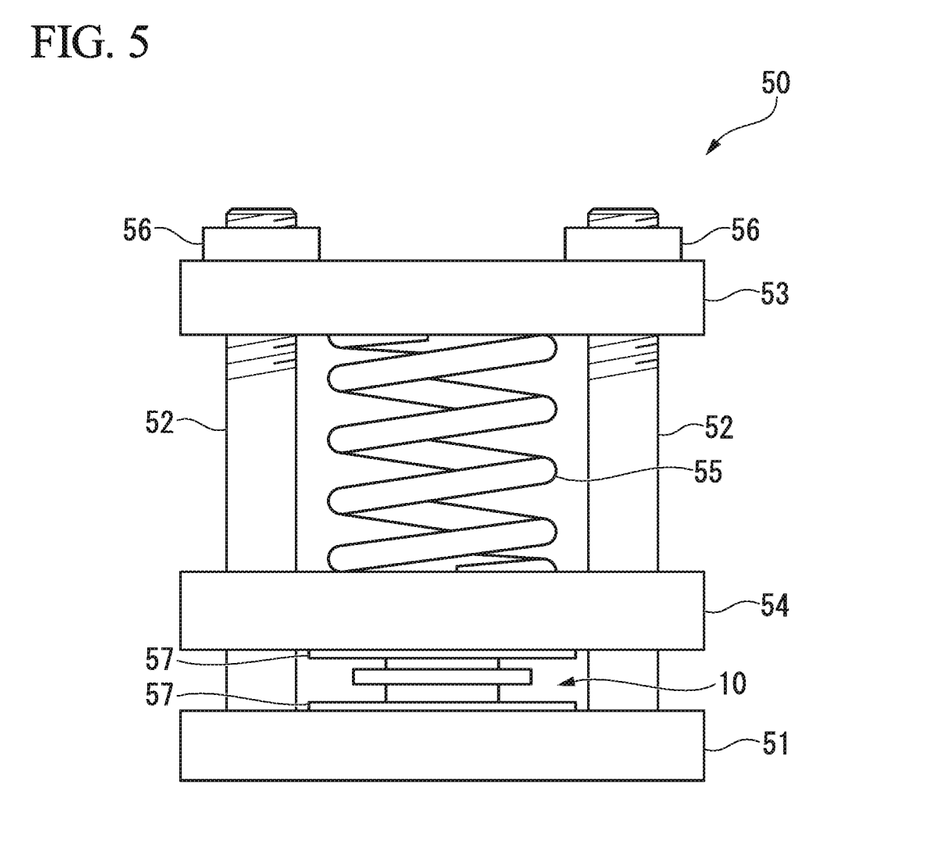
FIG. 5 is an explanatory diagram of a pressing device used in the method of manufacturing the power module substrate according to the embodiment of the present invention.

Here, in the present embodiment, the laminate described above is pressed in the laminating direction using a pressing device 50 shown in FIG. 5. The pressing device 50 includes a base plate 51, guide posts 52 vertically attached to four corners of an upper surface of the base plate 51, a fixing plate 53 disposed at upper end portions of the guide posts 52, a pressing plate 54 which is movable up and down freely between the base plate 51 and the fixing plate 53 and supported by a guide post 52, an urging means 55 such as a spring which is provided between the fixing plate 53 and the pressing plate 54 and is for urging the pressing plate 54 downward, and an adjusting screw 56 for moving the fixing plate 53 up and down.

The fixing plate 53 and the pressing plate 54 are disposed in parallel with the base plate 51. The laminate described above is disposed between the base plate 51 and the pressing plate 54 via a carbon sheet 57.

Therefore, the pressing device 50 has a structure in which the fixing plate 53 is caused to move up and down by adjusting a position of the adjusting screw 56 and the pressing plate 54 is pushed by urging means 55, thereby pressing the laminate.

In the pressing device 50, a thermal expansion coefficient of the guide post 52 is set to be greater than a thermal expansion coefficient of the urging means 55. When heating is performed up to the bonding temperature in a state of being pressed at room temperature, there is a possibility that a pressing load is lowered.

Accordingly, in the heating step S12 using the pressing device 50, the pressing load in the bonding temperature described above is in a range of 0.01 kgf/cm² or more and less than 1.0 kgf/cm² (0.98 kPa or more and less than 98 kPa).

Here, in a case where the pressing load in the bonding temperature described above is less than 0.01 kgf/cm² (0.98 kPa), there is a possibility that warping of the ceramic substrate 11 cannot be corrected. In addition, there is a possibility that at the time of forming the molten metal area, positional deviation of the aluminum plates 22 and 23 occurs. On the other hand, in a case where the pressing load in the bonding temperature described above is 1.0 kgf/cm² (98 kPa) or more, there is a possibility that an amount of Mg segregated in the bonded interface excessively increases thereby deteriorating the bonding reliability.

From the above description, in the present embodiment, the pressing load in the bonding temperature described above is in a range of 0.01 kgf/cm² or more and less than 1.0 kgf/cm² (0.98 kPa or more and less than 98 kPa). The pressing load in the bonding temperature described above is preferably 0.05 kgf/cm² or more and less than 0.9 kgf/cm², but is not limited thereto.

In the molten metal-solidifying step S13, molten metal areas respectively formed in the interfaces between the aluminum plates 22 and 23 and the ceramic substrate 11 are solidified to bond the ceramic substrate 11 to the aluminum plate 22 and aluminum plate 23.

Accordingly, the power module substrate 10 is manufactured in which the circuit layer 12 and the metal layer 13 are formed on the ceramic substrate 11.

(Heat Sink-Bonding Step S02)

Next, the radiator plate 41 is bonded to the other face (a face on the opposite side to the ceramic substrate 11) of the metal layer 13 of the power module substrate 10 via the second solder layer 4 and the radiator plate 41 is fastened to the cooler 42 by the fixing screw 45. Accordingly, the heat sink 40 and the power module substrate 10 are bonded to each other.

(Semiconductor Element Mounting Step S03)

In addition, the semiconductor element 3 is mounted to one face (a face on the opposite side to the ceramic substrate 11) of the circuit layer 12 via the first solder layer 2. Accordingly, the power module 1 according to the present embodiment is produced.

In the power module substrate 10 according to the present embodiment configured as described above, since the Mg-containing oxides 36 having a spinel crystal structure are dispersed in the circuit layer 12 or the metal layer 13 within the range of 2 μm in the thickness direction from the bonded interface 30 with the ceramic substrate 11, the oxide films formed on the surfaces of the aluminum plates 22 and 23 serving as the circuit layer 12 and the metal layer 13 are sufficiently removed by reaction with the Mg, and it becomes possible to reliably bond the circuit layer 12 to the ceramic substrate 11, and the metal layer 13 to the ceramic substrate 11.

Here, in the present embodiment, since the area ratio of the Mg-containing oxide 36 within a range of 2 μm in the thickness direction from the bonded interface 30 is 2% or higher, the oxide films formed on the surfaces of the aluminum plates 22 and 23 serving as the circuit layer 12 and the metal layer 13 can be reliably removed, and it becomes possible to reliably bond the circuit layer 12 to the ceramic substrate 11, and the metal layer 13 to the ceramic substrate 11.

Further, since the area ratio of the Mg-containing oxide 36 within a range of 2 in the thickness direction from the bonded interface 30 is 18% or lower, the Mg-containing oxide 36 is not excessively present and cracking or the like in the vicinity of the bonded interface 30 can be prevented from occurring.

In addition, in the power module substrate 10 according to the present embodiment, the segregated portion 31 in which Mg, Si, and O are segregated is included in the vicinity of the bonded interface 30 of the circuit layer 12 and the metal layer 13, to which the aluminum plates 22 and 23 are bonded respectively, with the ceramic substrate 11. The ratios of the amount of Mg $[Mg]_S$, the amount of Si $[Si]_S$, and the amount of O $[O]_S$ in the segregated portion 31 to the amount of Mg $[Mg]_I$, the amount of Si $[Si]_I$, and the amount of O $[O]_I$, respectively, at the position spaced by H=10 μm from the bonded interface 30 toward the circuit layer 12 side or the metal layer 13 side are within ranges of $1<[Mg]_S/[Mg]_I \leq 15$, $1<[Si]_S/[Si]_I \leq 25$, and $1<[O]_S/[O]_I \leq 25$. Therefore, it is possible to stabilize interfacial energy and improve bonding reliability of the circuit layer 12 and the metal layer 13 to the ceramic substrate 11.

In addition, the vicinity of the bonded interfaces 30 of the circuit layer 12 and the metal layer 13 with the ceramic substrate 11 can be prevented from excessively hardening. When the temperature cycle is loaded on the power module substrate 10, cracking or the like can be prevented from occurring in the ceramic substrate 11.

Here, in a case where $[Mg]_S/[Mg]_I$ is 1 or lower, $[Si]_S/[Si]_I$ is 1 or lower, and $[O]_S/[O]_I$ is 1 or lower, there is a possibility that bonding reliability of the circuit layer 12 and the metal layer 13 to the ceramic substrate 11 cannot be sufficiently improved. On the other hand, in a case where $[Mg]_S/[Mg]_I$ exceeds 15, $[Si]_S/[Si]_I$ exceeds 25, and $[O]_S/[O]_I$ exceeds 25, there is a possibility that crack occurs in the ceramic substrate 11.

Accordingly, in the present embodiment, the ratios of the amount of Mg $[Mg]_S$, the amount of Si $[Si]_S$, and the amount of O $[O]_S$ in the segregated portion 31 to the amount of Mg $[Mg]_I$, the amount of Si $[Si]_I$, and the amount of O $[O]_I$, respectively, at the position spaced by H=10 μm from the bonded interface 30 toward the circuit layer 12 side or the metal layer 13 side are within ranges of $1<[Mg]_S/[Mg]_I \leq 15$, $1<[Si]_S/[Si]_I \leq 25$, and $1<[O]_S/[O]_I \leq 25$.

Further, since the amount of Mg $[Mg]_I$ at the position spaced by H=10 μm from the bonded interface 30 toward the circuit layer 12 side or the metal layer 13 side is 0.8 mass % or less, the circuit layer 12 and the metal layer 13 themselves can be prevented from hardening and cracking or the like can be prevented from occurring in the ceramic substrate 11.

Particularly, in the present embodiment, since in the segregated portion 31, the amount of Cu is limited to 1.2 mass % or less and the amount of Fe is limited to 0.6 mass % or less, the vicinity of the bonded interfaces 30 of the circuit layer 12 and the metal layer 13 with the ceramic substrate 11 can be prevented from excessively hardening and cracking or the like can be prevented from occurring in the ceramic substrate 11.

In addition, in the present embodiment, since in the heating step S12, the pressing load in a predetermined bonding temperature is in a range of 0.01 kgf/cm² or more and less than 1 kgf/cm² (0.98 kPa or more and less than 98 kPa), an interfacial reaction does not excessively occur and Mg is prevented from being excessively segregated in the vicinity of the bonded interface 30, thereby making it possible to segregate an appropriate amount of Mg. Accordingly, it is possible to manufacture the power module substrate 10 in which the ratios of the amount of Mg $[Mg]_S$, the amount of Si $[Si]_S$, and the amount of O $[O]_S$ in the segregated portion 31 to the amount of Mg $[Mg]_I$, the amount of Si $[Si]_I$, respectively, and the amount of O $[O]_I$ at the position spaced by H=10 μm from the bonded interface 30 toward the circuit layer 12 side or the metal layer 13 side are respectively within ranges of $1<[Mg]_S/[Mg]_I \leq 15$, $1<[Si]_S/[Si]_I \leq 25$, and $1<[O]_S/[O]_I \leq 25$.

Hereinabove, the embodiment of the present invention is described. However, the present invention is not limited thereto and can be appropriately modified without departing from the technical idea of the invention.

For example, in the present embodiment, the power module substrate is described as an example, but the present invention is not limited thereto, as long as it is a ceramic-aluminum bonded body formed by bonding the ceramic member made of AlN and the aluminum member to each other.

In addition, in the present embodiment, a description was made in which each of the circuit layer and the metal layer is formed by bonding an aluminum (4N aluminum) rolled sheet having a purity of 99.99 mass % or higher, but the present invention is not limited thereto, as long as at least one of the circuit layer and the metal layer is made of pure aluminum such as aluminum (2N aluminum) having a purity of 99 mass % or higher or aluminum (3N aluminum) having a purity of 99.9 mass % or higher or aluminum alloy such as A3003 (Si: 0.6 mass % or less, Fe: 0.7 mass % or less, Cu: 0.05 mass % or more and 0.20 mass % or less, Mn: 1.0 mass % or more and 1.5 mass % or less, Zn: 0.10 mass % or less, and Al: balance).

Further, in a case where the metal layer is made of an aluminum plate, the circuit layer may be made of a copper plate made of copper or a copper alloy, a laminated plate of aluminum and copper, or the like. In addition, in a case where the circuit layer is made of the aluminum plate, the metal layer may be made of a copper plate made of copper or a copper alloy, a laminated plate of aluminum and copper, or the like, and may be set as a structure not forming the metal layer.

Further, a description was made in which the Ni-plated layer is formed on a face of the circuit layer and the metal layer to be subjected to solder-bonding, but the present invention is not limited thereto. A base layer may be formed by other means such as Ag paste.

In addition, the heat sink is not limited to the example in the present embodiment, and there is no particular limitation in a structure of the heat sink Example Verification experiments conducted to confirm the effectiveness of the present invention will be described.

As an aluminum plate forming the circuit layer, a rolled sheet (37 mm×37 mm) having the composition and the thickness shown in Table 1 was prepared.

As a ceramic substrate, a substrate (40 mm×40 mm) having the composition and the thickness shown in Table 1 was prepared.

Further, as the aluminum plate forming the metal layer, an aluminum (4N aluminum) rolled sheet (37 mm×37 mm×thickness 1.6 mm) having a purity of 99.99 mass % or higher was prepared.

The aluminum plate forming the circuit layer and the aluminum plate forming the metal layer were laminated to the ceramic substrate via the brazing material (thickness 20 μm) shown in Table 1, and brazed under the conditions shown in Table 1. The power module substrate for an evaluation was manufactured.

(Compositions of Segregated Layer and Circuit Layer)

A composition ($[Mg]_S$, $[Si]_S$, $[O]_S$, Cu, and Fe) of the segregated layer and a composition ($[Mg]_I$, $[Si]_I$, and $[O]_I$) in the circuit layer were measured by the following method.

The obtained power module substrate was mechanically cut in the laminating direction. The obtained cross section was mechanically polished to a thickness of approximately 50 μm to obtain a cross section sample. 4 kV argon ions were caused to be implanted to the vicinity of the bonded interface from up and down sides (face perpendicular to the laminating direction) at an angle of 4 degrees, and the cross section sample was flacked by sputtering until a hole was bored. Since an edge of the hole becomes an edge shape and the thickness at which the electron beam can pass is approximately 0.1 μm, the portion was measured with a TEM and an EDS and the composition of the segregated layer was measured.

The measurement of the TEM and the EDS was performed using the Titan ChemiSTEM (manufactured by FEI Company, with an EDS detector) under the acceleration voltage of 200 kV and a beam diameter of 1 nm, at a magnification of one million times.

In addition, a composition at a position spaced by 10 μm from the bonded interface toward the aluminum plate side was taken as the composition in the circuit layer.

The measurement was performed at five places, and the average value thereof was taken as the composition. The evaluation results are shown in Table 2.

(Measuring Area Ratio of Mg-Containing Oxide Having Spinel Crystal Structure)

In a range of 2 μm in the thickness direction from the bonded interface between the ceramic substrate and the metal layer, an electron diffraction pattern was obtained using a transmission electron microscope (Titan ChemiSTEM manufactured by FEI Company, an acceleration voltage of 200 kV) to analyze a composition using an energy-dispersive X-ray spectroscopy (NSS7 manufactured by Thermo Fisher Scientific Inc.). An area which was identified as the spinel structure from the electron diffraction pattern and an area in which the composition was Mg=6 to 12 at %, O=30 to 60 at %, and Al=balance were taken as Mg-containing oxide and presence or absence of the Mg-containing oxide was investigated. The electron diffraction pattern was obtained by performing irradiation with an electron beam narrowed down to approximately 1 nm (NBD method).

Next, mapping of N and Mg was performed using the transmission electron microscope (Titan ChemiSTEM manufactured by FEI Company) at a magnification of 10000 times within a range of 2 μm in the thickness direction from the bonded interface between the ceramic substrate and the metal layer. A boundary between an area in which N was detected and an area in which N was not detected was set as the bonded interface. An area in which a concentration of Mg was 6 to 12 at % from the mapping of Mg was set as Mg-containing oxide. Binarization was performed. Then the area ratio of the Mg-containing oxide was obtained by dividing the area of the Mg-containing oxide by the measurement area. The measurement was performed at five places, and the average value thereof was taken as the area ratio.

The area ratios of the Mg-containing oxide having the spinel crystal structure within a range of 2 μm in the thickness direction from the bonded interface are shown in Table 3.

(Bonding Rate)

The heat sink was bonded to the other face of the metal layer of the power module substrate described above. The heat sink was 50 mm×60 mm×5 mmt of A3003 alloy aluminum plate.

As bonding conditions, bonding was performed using Al—Si brazing foil by heating at 610° C. in vacuum in a state of being pressed at 3.0 kgf/cm$^2$ (0.29 MPa).

A temperature cycle test was carried out using the heat sink-attached power module substrate obtained in this manner.

As a thermal shock-testing device, TSB-51 (manufactured by ESPEC CORP.) was used. One cycle was set for 5 minutes at −40° C. and 5 minutes at 150° C. and 2000 cycles of test were carried out on the heat sink-attached power module substrate in a liquid phase (Fluorinert). Then, the bonding rate between the circuit layer and the ceramic substrate was evaluated as described below. An evaluation of the bonding rate was performed before the temperature cycle test (initial bonding rate) and after the temperature cycle test (bonding rate after cycles).

In the evaluation of the bonding rate, with respect to the heat sink-attached power module substrate, the bonding rate of the interface between the ceramic substrate and the metal layer was evaluated using an ultrasonic flaw detection device (FineSAT200 manufactured by Hitachi Power Solutions Co., Ltd.) and the bonding rate was calculated from the following formula. The evaluation results are shown in Table 3.

Here, the initial bonding area was set to an area to be bonded before the bonding, that is, an area (37 mm×37 mm) of the metal layer in the present example. In the image obtained by binarizing the ultrasonic flaw detection images, since the peeling was shown by a white portion in the bonded portion, the area of the white portion was taken as a peeled area.

(Bonding Rate)={(Initial Area to be Bonded)−(Peeled Area)}/(Initial Area to be Bonded)×100

(Crack in Ceramic Substrate)

The temperature cycle test was carried out using the heat sink-attached power module substrate described above. The measurement conditions are shown below. After 2000 cycles, the presence or absence of cracking in the ceramic substrate was confirmed using the ultrasonic flaw detection device. The evaluation results are shown in Table 3.

Device for Evaluation: TSB-51 manufactured by ESPEC CORP

Liquid Phase: Fluorinert

Temperature Condition: One cycle was set for 5 minutes at −40° C. and 5 minutes at 150° C.

TABLE 1

| | | Circuit Layer | | | | | | Ceramic Substrate | |
|---|---|---|---|---|---|---|---|---|---|
| | | Al | Si mass % | Cu mass % | Fe mass % | Mg mass % | Mn mass % | Thickness mm | Material | Thickness mm |
| Present Invention Example | 1 | Balance | 0.001 | 0.0053 | 0.0018 | 0.0001 | 0.0001 | 0.6 | AlN | 0.635 |
| | 2 | Balance | 0.001 | 0.0053 | 0.0018 | 0.0001 | 0.0001 | 0.4 | AlN | 0.635 |
| | 3 | Balance | 0.001 | 0.0053 | 0.0018 | 0.0001 | 0.0001 | 1 | AlN | 0.635 |
| | 4 | Balance | 0.001 | 0.0053 | 0.0018 | 0.0001 | 0.0001 | 0.6 | AlN | 0.635 |
| | 5 | Balance | 0.001 | 0.0053 | 0.0018 | 0.0001 | 0.0001 | 0.4 | AlN | 0.635 |
| | 6 | Balance | 0.022 | 0.001 | 0.091 | 0.0040 | 0.0010 | 0.4 | AlN | 0.635 |
| | 7 | Balance | 0.022 | 0.001 | 0.091 | 0.0040 | 0.0010 | 0.6 | AlN | 1 |
| | 8 | Balance | 0.001 | 0.98 | 0.0014 | 0.0001 | 0.0001 | 0.3 | AlN | 1 |
| | 9 | Balance | 0.001 | 1.58 | 0.085 | 0.0001 | 0.0001 | 0.8 | AlN | 1 |
| | 10 | Balance | 0.001 | 0.51 | 0.49 | 0.0001 | 0.0001 | 0.4 | AlN | 1 |
| | 11 | Balance | 0.001 | 0.48 | 1.12 | 0.0001 | 0.0001 | 0.6 | AlN | 0.635 |
| | 12 | Balance | 0.001 | 0.0053 | 0.0018 | 0.0001 | 0.0001 | 0.3 | AlN | 0.635 |
| | 13 | Balance | 0.001 | 0.0053 | 0.0018 | 0.0001 | 0.0001 | 0.4 | AlN | 0.635 |
| | 14 | Balance | 0.001 | 0.0053 | 0.0018 | 0.0001 | 0.0001 | 0.5 | AlN | 0.635 |
| | 15 | Balance | 0.032 | 0.027 | 0.32 | 0.001 | 0.002 | 1 | AlN | 0.635 |
| | 16 | Balance | 0.032 | 0.027 | 0.32 | 0.001 | 0.002 | 0.4 | AlN | 0.635 |
| | 17 | Balance | 0.26 | 0.15 | 0.23 | 0.015 | 1.14 | 0.08 | AlN | 0.635 |
| | 18 | Balance | 0.26 | 0.15 | 0.23 | 0.015 | 1.14 | 0.2 | AlN | 0.635 |
| Comparative Example | 1 | Balance | 0.001 | 0.0053 | 0.0018 | 0.0001 | 0.0001 | 0.6 | AlN | 0.635 |
| | 2 | Balance | 0.001 | 0.0053 | 0.0018 | 0.0001 | 0.0001 | 0.6 | AlN | 1 |
| | 3 | Balance | 0.001 | 0.0053 | 0.0018 | 0.0001 | 0.0001 | 0.4 | AlN | 0.635 |
| | 4 | Balance | 0.001 | 0.0053 | 0.0018 | 0.0001 | 0.0001 | 0.6 | AlN | 0.635 |
| | 5 | Balance | 0.001 | 0.0053 | 0.0018 | 0.0001 | 0.0001 | 0.6 | AlN | 0.635 |
| | 6 | Balance | 0.001 | 0.0053 | 0.0018 | 0.0001 | 0.0001 | 0.4 | AlN | 1 |
| | 7 | Balance | 0.001 | 0.0053 | 0.0018 | 0.0001 | 0.0001 | 0.6 | AlN | 1 |
| | 8 | Balance | 0.001 | 0.0053 | 0.0018 | 0.0001 | 0.0001 | 0.6 | $Al_2O_3$ | 0.635 |

| | | | | | Bonding Condition | | |
|---|---|---|---|---|---|---|---|
| | | Brazing Material | | | Bonding | | Pressing |
| | | Al | Si mass % | Mg mass % | Atmosphere | Temperature ° C. | Holding Time min | Load kgf/cm² |
| Present Invention Example | 1 | Balance | 7.5 | 0.01 | Vacuum | 640 | 1 | 0.90 |
| | 2 | Balance | 7.5 | 0.02 | Vacuum | 640 | 1 | 0.40 |
| | 3 | Balance | 7.5 | 0.05 | Vacuum | 580 | 120 | 0.20 |
| | 4 | Balance | 7.5 | 0.03 | Nitrogen | 590 | 180 | 0.05 |
| | 5 | Balance | 7.5 | 0.01 | Vacuum | 640 | 180 | 0.02 |
| | 6 | Balance | 7.5 | 0.04 | Nitrogen | 620 | 15 | 0.60 |
| | 7 | Balance | 7.5 | 0.01 | Nitrogen | 620 | 15 | 0.80 |
| | 8 | Balance | 7.5 | 0.04 | Vacuum | 600 | 30 | 0.01 |
| | 9 | Balance | 7.5 | 0.03 | Vacuum | 600 | 30 | 0.30 |
| | 10 | Balance | 7.5 | 0.03 | Vacuum | 600 | 30 | 0.50 |
| | 11 | Balance | 10.5 | 0.04 | Nitrogen | 590 | 90 | 0.60 |
| | 12 | Balance | 10.5 | 0.04 | Nitrogen | 590 | 45 | 0.80 |
| | 13 | Balance | 12 | 0.05 | Nitrogen | 590 | 45 | 0.70 |
| | 14 | Balance | 12 | 0.01 | Vacuum | 600 | 60 | 1.00 |
| | 15 | Balance | 1.5 | 0.02 | Vacuum | 650 | 15 | 0.90 |
| | 16 | Balance | 1.5 | 0.01 | Vacuum | 650 | 15 | 0.60 |
| | 17 | Balance | 5.5 | 0.04 | Vacuum | 600 | 45 | 0.80 |
| | 18 | Balance | 5.5 | 0.02 | Nitrogen | 600 | 45 | 0.80 |
| Comparative Example | 1 | Balance | 7.5 | 0.002 | Vacuum | 620 | 180 | 0.80 |
| | 2 | Balance | 7.5 | 0.005 | Vacuum | 620 | 180 | 0.60 |
| | 3 | Balance | 7.5 | 0.15 | Vacuum | 620 | 180 | 2.00 |
| | 4 | Balance | 0.5 | 0.03 | Vacuum | 620 | 180 | 0.80 |
| | 5 | Balance | 20 | 0.03 | Vacuum | 620 | 180 | 3.00 |
| | 6 | Balance | 0.8 | 0.008 | Vacuum | 620 | 180 | 1.00 |
| | 7 | Balance | 13 | 0.25 | Vacuum | 620 | 180 | 1.00 |
| | 8 | Balance | 15 | 0.04 | Vacuum | 620 | 180 | 0.50 |

TABLE 2

| | | Amount of Mg (mass %) | | | Amount of Si (mass %) | | | Amount of O (mass %) | | |
|---|---|---|---|---|---|---|---|---|---|---|
| | | $[Mg]_s$ | $[Mg]_l$ | $[Mg]_s/[Mg]_l$ | $[Si]_s$ | $[Si]_l$ | $[Si]_s/[Si]_l$ | $[O]_s$ | $[O]_l$ | $[O]_s/[O]_l$ |
| Present Invention Example | 1 | 0.88 | 0.77 | 1.14 | 1.14 | 0.22 | 5.18 | 11.40 | 3.24 | 3.52 |
| | 2 | 0.74 | 0.05 | 14.80 | 1.31 | 0.18 | 7.28 | 5.45 | 3.45 | 1.58 |
| | 3 | 1.37 | 0.80 | 1.71 | 1.84 | 0.19 | 9.68 | 5.28 | 2.74 | 1.93 |
| | 4 | 0.66 | 0.12 | 5.50 | 0.37 | 0.32 | 1.16 | 5.12 | 0.67 | 7.64 |
| | 5 | 1.41 | 0.54 | 2.61 | 1.47 | 0.06 | 24.50 | 4.38 | 0.20 | 21.90 |
| | 6 | 0.24 | 0.10 | 2.40 | 2.22 | 0.39 | 5.69 | 4.95 | 4.11 | 1.20 |
| | 7 | 0.32 | 0.23 | 1.39 | 2.13 | 0.35 | 6.09 | 14.90 | 0.61 | 24.43 |
| | 8 | 1.16 | 0.34 | 3.41 | 1.76 | 0.24 | 7.33 | 4.91 | 2.96 | 1.66 |
| | 9 | 1.43 | 0.48 | 2.98 | 1.92 | 0.23 | 8.35 | 14.52 | 4.74 | 3.06 |
| | 10 | 0.94 | 0.62 | 1.52 | 1.84 | 0.27 | 6.81 | 10.84 | 9.33 | 1.16 |
| | 11 | 0.67 | 0.21 | 3.19 | 0.63 | 0.34 | 1.85 | 12.31 | 4.58 | 2.69 |
| | 12 | 1.39 | 0.44 | 3.16 | 0.85 | 0.38 | 2.24 | 10.56 | 9.46 | 1.12 |
| | 13 | 0.76 | 0.06 | 12.67 | 0.90 | 0.39 | 2.31 | 10.32 | 0.88 | 11.73 |
| | 14 | 1.19 | 0.50 | 2.38 | 1.91 | 0.16 | 11.94 | 9.36 | 6.45 | 1.45 |
| | 15 | 1.50 | 0.67 | 2.24 | 2.12 | 0.26 | 8.15 | 11.53 | 4.30 | 2.68 |
| | 16 | 0.83 | 0.40 | 2.08 | 1.92 | 0.28 | 6.86 | 12.97 | 1.34 | 9.68 |
| | 17 | 0.43 | 0.25 | 1.72 | 2.14 | 0.20 | 10.70 | 11.51 | 1.04 | 11.07 |
| | 18 | 1.15 | 0.21 | 5.48 | 2.09 | 0.21 | 9.95 | 13.57 | 4.28 | 3.17 |
| Comparative Example | 1 | 0.002 | 0.01 | 0.20 | 2.03 | 0.16 | 12.69 | 13.26 | 8.64 | 1.53 |
| | 2 | 0.19 | 0.01 | 19.00 | 2.29 | 0.18 | 12.72 | 13.84 | 4.52 | 3.06 |
| | 3 | 1.90 | 1.30 | 1.46 | 2.15 | 0.18 | 11.94 | 11.56 | 7.53 | 1.54 |
| | 4 | 1.09 | 0.40 | 2.73 | 0.08 | 0.11 | 0.73 | 7.32 | 4.65 | 1.57 |
| | 5 | 1.02 | 0.50 | 2.04 | 5.20 | 0.14 | 37.14 | 11.26 | 7.96 | 1.41 |
| | 6 | 0.21 | 0.02 | 10.50 | 0.16 | 0.12 | 1.33 | 5.21 | 7.73 | 0.67 |
| | 7 | 2.20 | 1.35 | 1.63 | 4.22 | 0.18 | 23.44 | 17.30 | 0.65 | 26.62 |
| | 8 | 0.00 | 0.30 | 0.00 | 4.67 | 0.16 | 29.19 | 13.51 | 0.48 | 28.15 |

TABLE 3

| | | Mg-Containing Oxide Area Ratio % | Segregated Portion | | Evaluation | | |
|---|---|---|---|---|---|---|---|
| | | | Cu mass % | Fe mass % | Initial Bonding Rate % | Bonding Rate After Cycle % | Crack of Ceramic Substrate |
| Present Invention Example | 1 | 2.9 | 0.00 | 0.00 | 97.3 | 92.9 | Absence |
| | 2 | 7.1 | 0.02 | 0.01 | 99.1 | 92.1 | Absence |
| | 3 | 13.9 | 0.01 | 0.00 | 99.4 | 92.4 | Absence |
| | 4 | 8.3 | 0.00 | 0.00 | 97.4 | 92.4 | Absence |
| | 5 | 5.4 | 0.00 | 0.00 | 99.1 | 91.5 | Absence |
| | 6 | 11.2 | 0.00 | 0.11 | 97.9 | 92.2 | Absence |
| | 7 | 4.8 | 0.01 | 0.11 | 98.7 | 91.2 | Absence |
| | 8 | 13.7 | 1.20 | 0.00 | 98.4 | 91.8 | Absence |
| | 9 | 8.4 | 1.90 | 0.10 | 97.7 | 88.2 | Absence |
| | 10 | 10.6 | 0.60 | 0.60 | 98.6 | 92.7 | Absence |
| | 11 | 12.0 | 0.60 | 1.30 | 99.4 | 87.6 | Absence |
| | 12 | 12.1 | 0.02 | 0.00 | 99.4 | 93.1 | Absence |
| | 13 | 17.9 | 0.01 | 0.01 | 99.0 | 90.6 | Absence |
| | 14 | 2.6 | 0.01 | 0.02 | 99.2 | 91.2 | Absence |
| | 15 | 6.7 | 0.03 | 0.38 | 99.5 | 91.4 | Absence |
| | 16 | 4.1 | 0.02 | 0.36 | 97.5 | 90.6 | Absence |
| | 17 | 13.1 | 0.21 | 0.30 | 98.9 | 93.8 | Absence |
| | 18 | 6.4 | 0.20 | 0.31 | 99.0 | 91.0 | Absence |
| Comparative Example | 1 | 1.2 | 0.01 | 0.00 | 98.3 | 80.7 | Absence |
| | 2 | 1.6 | 0.02 | 0.00 | 97.7 | 73.2 | Presence |
| | 3 | 24.2 | 0.00 | 0.01 | 99.4 | 81.3 | Presence |
| | 4 | 9.2 | 0.00 | 0.02 | 20.2 | 0.0 | — |
| | 5 | 10.7 | 0.01 | 0.01 | 99.4 | 75.9 | Presence |
| | 6 | 2.1 | 0.00 | 0.00 | 38.2 | 0.0 | — |
| | 7 | 26.8 | 0.02 | 0.00 | 98.1 | 76.8 | Presence |
| | 8 | 13.2 | 0.00 | 0.01 | 97.4 | 78.3 | Absence |

In Present Invention Examples 1 to 18 in which the ratios of the Mg, Si, and O in the segregated portion were within a range of the present invention, it was confirmed that the initial bonding rate was high, in addition, cracking did not occur in the ceramic substrate after the temperature cycle test, and the bonding reliability was also high.

Meanwhile, Comparative Examples 1, 4, and 6 in which the ratios of Mg, Si, and O were less than the range of the present invention, it was confirmed that the bonding ratio deteriorated. In Comparative Examples 2, 5, and 7 in which the ratios of Mg, Si, and O were within the range of the present invention or in Comparative Example 3 in which $[Mg]_l$ exceeded 0.8 mass %, cracking in the ceramic substrate was confirmed. In addition, in Comparative Example 8 in which $Al_2O_3$ was used for the ceramic substrate, $[Mg]_S/[Mg]_I$ was out of the range of the present invention and the bonding rate after the temperature cycle test was lowered.

INDUSTRIAL APPLICABILITY

According to the present invention, it is possible to provide a ceramic-aluminum bonded body, a power module substrate, and a power module including the power module substrate, in each of which the ceramic member and the aluminum member are reliably bonded to each other, and which are excellent in bonding reliability at the time of temperature cycle load and capable of suppressing the occurrence of cracking in the ceramic member.

REFERENCE SIGNS LIST

10 Power module substrate (ceramic-aluminum bonded body)
11 Ceramic substrate (ceramic member)
12 Circuit layer (aluminum member)
13 Metal layer (aluminum member)
24 Al—Si—Mg-based brazing material
25 Al—Si—Mg-based brazing material

What is claimed is:

1. A ceramic-aluminum bonded body comprising: a ceramic member made of AlN; and an aluminum member, the ceramic member and the aluminum member being bonded together, wherein
Mg-containing oxides having a spinel crystal structure are dispersed in the aluminum member within a range of 2 µm in a thickness direction from a bonded interface with the ceramic member,
a segregated portion in which Mg, Si, and O are segregated is formed in the aluminum member in the vicinity of the bonded interface with the ceramic member,
ratios of an amount of Mg $[Mg]_S$, an amount of Si $[Si]_S$, and an amount of O $[O]_S$ in the segregated portion to an amount of Mg $[Mg]_I$, an amount of Si $[Si]_I$, and an amount of O $[O]_I$, respectively, at a position spaced by 10 µm from the bonded interface toward an aluminum member side are within ranges of
$1<[Mg]_S/[Mg]_I\leq15$,
$1<[Si]_S/[Si]_I\leq25$, and
$1<[O]_S/[O]_I\leq25$, and
the amount of Mg $[Mg]_I$ at the position spaced by 10 µm from the bonded interface toward the aluminum member side is 0.8 mass % or less.

2. The ceramic-aluminum bonded body according to claim 1, wherein
in the segregated portion, an amount of Cu is 1.2 mass % or less, and an amount of Fe is 0.6 mass % or less.

3. A power module substrate, comprising:
a ceramic substrate made of AlN; and an aluminum plate bonded to the ceramic substrate,
wherein Mg-containing oxides having a spinel crystal structure are dispersed in the aluminum plate within a range of 2 µm in a thickness direction from a bonded interface with the ceramic substrate,
a segregated portion in which Mg, Si, and O are segregated is in an area of the aluminum plate in the vicinity of the bonded interface with the ceramic substrate,
ratios of an amount of Mg $[Mg]_S$, an amount of Si $[Si]_S$, and an amount of O $[O]_S$ in the segregated portion to an amount of Mg $[Mg]_I$, an amount of Si $[Si]_I$, respectively, and an amount of O $[O]_I$ at a position spaced by 10 µm from the bonded interface toward an aluminum plate side are within ranges of
$1<[Mg]_S/[Mg]_I\leq15$,
$1<[Si]_S/[Si]_I\leq25$, and
$1<[O]_S/[O]_I\leq25$, and
the amount of Mg $[Mg]_I$ at the position spaced by 10 µm from the bonded interface toward the aluminum plate side is 0.8 mass % or less.

4. A power module substrate according to claim 3, wherein
in the segregated portion, an amount of Cu is 1.2 mass % or less, and an amount of Fe is 0.6 mass % or less.

5. A power module, comprising:
the power module substrate according to claim 3; and
a semiconductor element.

6. A power module, comprising:
the power module substrate according to claim 4; and
a semiconductor element.

* * * * *